United States Patent [19]
Ishii et al.

[11] Patent Number: 4,772,569
[45] Date of Patent: Sep. 20, 1988

[54] METHOD FOR FORMING OXIDE ISOLATION FILMS ON FRENCH SIDEWALLS

[75] Inventors: Tatsuya Ishii; Ikuo Ogoh, both of Hyogo, Japan

[73] Assignee: Mitsubishi Denki Kabushiki Kaisha, Tokyo, Japan

[21] Appl. No.: 113,744

[22] Filed: Oct. 28, 1987

[30] Foreign Application Priority Data

Oct. 30, 1986 [JP] Japan ................... 61-258979
Oct. 30, 1986 [JP] Japan ................... 61-258980

[51] Int. Cl.4 ............... H01L 21/308; H01L 21/316
[52] U.S. Cl. .......................................... 437/67; 437/72; 437/228; 437/239; 148/DIG. 117; 156/643; 156/649
[58] Field of Search ............ 156/643, 648, 649, 659.1, 156/661.1; 437/61, 62, 67, 69, 72, 73, 228, 239, 241, 249, 924, 968, 979, 984

[56] References Cited

U.S. PATENT DOCUMENTS 4,361,600 11/1982 Brown ................ 148/DIG. 117 X
4,549,927 10/1985 Goth et al. .................... 156/643
4,641,416 2/1987 Iranmanesh et al. ..... 148/DIG. 117 X
4,666,556 5/1987 Fulton et al. ................ 156/643

OTHER PUBLICATIONS

*J. Vac. Sci. Technol.*, J. M. Morel et al., "High Resolution Steep Profile Resist Patterns", Nov./Dec. 1979, pp. 1620–1624.

Primary Examiner—David L. Lacey
Assistant Examiner—Andrew J. Anderson
Attorney, Agent, or Firm—Lowe, Price, LeBlanc, Becker & Shur

[57] ABSTRACT

In a method according to the present invention for forming isolation oxide films (14) on a silicon substrate (11) having trenches and islands bounded by the trenches, the isolation oxide films are simultaneously formed in the island regions and in the side wall regions of the trenches by oxidizing the substrate (11) with a single patterned oxidation mask (12).

10 Claims, 3 Drawing Sheets

METHOD FOR FORMING OXIDE ISOLATION FILMS ON FRENCH SIDEWALLS

BACKGROUND OF THE INVENTION

1. Field of the Invention

This invention relates to a method for fabricating a semiconductor device and more particularly to a method for forming isolation films of an oxide on a semiconductor substrate having one or more trenches and one or more islands bounded by the trenches.

2. Description of the Prior Art

Recently, circuit elements are formed not only on a main surface of a semiconductor substrate but also on side walls of trenches cut into the main surface in order to provide a more highly integrated circuit device. Therefore, it is often necessary to form isolation films not only on the main surface but also on the side walls and bottom faces of the trenches.

FIGS. 1A to 1I are schematic fragmentary sectional views, illustrating the conventional steps for forming isolation oxide films on a silicon substrate having trenches and islands bounded by the trenches.

Referring to FIG. 1A, an oxidation mask layer 2 of silicon nitride is formed with an underlayer 3 of silicon oxide over an upper main surface of a silicon substrate 1.

Referring to FIG. 1B, the oxidation mask layer 2 is patterned by photolithography and then an isolation oxide film 4 is formed on the main surface by thermally oxidizing the silicon substrate 1. Thereafter, the patterned oxidation mask 2 is removed once and a net, oxidation mask layer 2 is again formed, covering the isolation film 4, over the entire main surface of the substrate 1.

Referring to FIG. 1C, an etching mask layer 5 of silicon oxide deposited on the new oxidation mask layer 2 is patterned by photolithography and then trenches are cut through the oxidation mask layer 2 and underlayer 3 into the substrate 1 by etching with the patterned etching mask 5.

Referring to FIG. 1D, the exposed silicon surfaces in the trenches of the substrate 1 are thermally oxidized and then the entire free surface over the substrate is covered with a further formed oxidation mask layer 2 of silicon nitride.

Referring to FIG. 1E, the oxidation mask layer 2 is patterned by etching with a multi-level resist which has been patterned by photolithography. In this figure, the oxidation mask layer 2 is removed in a side wall region of a trench where an isolation oxide film is to be formed, and the first-level resist 6 is shown as remained. A multi-level resist is described in detail by J. M. Moran et al. in *J. Vac. Sci. Technol.*, 16(6), 1979, pp. 1620–1624.

Referring to FIG. 1F, after the multi-level resist 6 is removed, the entire free surface over the substrate is covered with a silicon oxide layer 7.

Referring to FIG. 1G, the silicon oxide layer 7 is subjected to an anisotropic etching such as a reactive ion etching from above, thereby to remove the oxidation mask layer 2 and underlayer 3 in the bottom regions of the trenches.

Referring to FIG. 1H, the silicon oxide layers 7 and 5 are etched away.

Finally referring to FIG. 1I, the silicon substrate 1 is thermally oxidized with the patterned oxidation mask 2. As a result, isolation oxide films 4 are formed not only in the island region but also in the side wall and bottom regions of the trenches.

In the above described conventional method, the isolation oxide films in the trench regions can not be formed in a self-aligned manner with respect to those in the island regions, because the different oxidation masks are used for forming the isolation oxide films in the island regions and the trench regions. Thus, marginal areas must be given to allow a small mismatch in the mask alignment according to the pattern layout.

Further, if an etching region for forming a trench is partly overlapped with an isolation oxide film 4 on the main surface of the substrate 1 because of a small mismatch in the mask alignment of the etching mask 5 (refer to FIG. 1C), the isolation oxide film 4 will cause oblique etching of the substrate 1 and make the neighboring side wall of the trench inclined. When the side wall of the trench is inclined, it is likely that the silicon oxide layer 7 formed on the inclined side wall is removed during the reactive ion etchig from above (refer to FIG. 1G).

SUMMARY OF THE INVENTION

In view of the deficiencies in the above described prior art, it is a major object of the present invention to provide a method for forming isolation oxide films in a self-aligned manner in island regions and trench regions of a semiconductor substrate without making side walls of the trenches inclined.

According to an aspect of the present invention, a method for fabricating a semiconductor device which includes one or more trenches each having side walls and a bottom face as well as one or more islands bounded by the trenches, comprises the steps of: preparing a silicon substrate having an upper main surface; depositing an oxidation mask layer over the main surface; etching the oxidation mask layer and the substrate with a first etching mask, thereby to form the trenches and islands; depositing an additional oxidation mask layer to cover the entire free surface over the substrate; covering the entire free surface of the oxidation mask layer with a second etching mask layer; patterning the oxidation mask layer in the bottom regions of the trenches by anisotropically etching the second etching mask fron above; forming a third etching mask after removing the first and second etching masks; further patterning the oxidation mask layer in the island regions and in the side wall regions of the trenches by etching with the third etching mask; and oxidizing the substrate with the further patterned oxidation mask after removing the third etching mask, thereby to form isolation oxide films not only in the island regions but also in the side wall and bottom regions of the trenches.

According to another aspect of the present invention, a method for fabricating a semiconductor device which includes one or more trenches each having side walls and a bottom face as well as one or more islands bounded by the trenches, comprises the steps of: preparing a silicon substrate having an upper main surface; depositing an oxidation mask layer over the main surface; etching the oxidation mask layer and the substrate with a first etching mask, thereby to form the trenches and islands; depositing an additional oxidation mask layer to cover the entire free surface over the substrate; covering the entire free surface of the oxidation mask layer with a second etching mask layer; patterning the oxidation mask layer in the bottom regions of the trenches by anisotropically etching the second etching mask from above; oxidizing the substrate with the patterned oxidation mask after removing the first and second etching masks, thereby to form isolation oxide films in the bottom regions of the trench; further patterning the oxidation mask layer in the island regions and in the side wall regions of the trenches by etching with a third etching mask; and oxidizing the substrate with the further patterned oxidation mask after removing the third etching mask, thereby to form isolation oxide layer in the island regions and in the side wall regions of the trenches.

Accordingly, since the oxidation mask layer is patterned simultaneously in the island regions and in the side wall regions of the trenches, marginal area for allowing a small mismatch in the mask alignment is not needed. As a result, it becomes possible to provide a more highly integrated circuit device. In addition, the number of the processing steps is decreased.

Further, since the isolation oxide films in the island regions are not formed before the trenches are formed by etching, the oblique etching due to the partial overlapping of the etchin regions with the isolation oxide films in the island region can be avoided and thus the side walls of the trenches are prevented from being inclined. Therefore, the anisotropic etching from above can be accurately performed with the second etching mask layer on the vertical side walls of the trenches.

These objects and other objects, features, aspects and advantages of the present invention will become more apparent from the following detailed description of the present invention when taken in conjunction with the accompanying drawings.

BRIEF DESCRIPTION OF THE DRAWINGS

FIGS. 1A to 1I are schematic fragmentary sectional views, illustrating the conventional method for forming isolation oxide films on a silicon substrate having trenches and islands bounded by the trenches;

DESCRIPTION OF THE PREFERRED EMBODIMENTS

FIGS. 2A to 2G illustrate an embodiment according to the present invention.

Figure 1A:
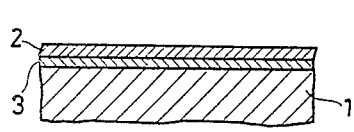
Figure 1B:
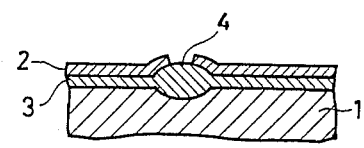
Figure 1C:
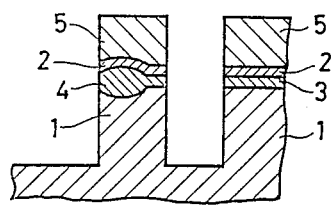
Figure 1D:
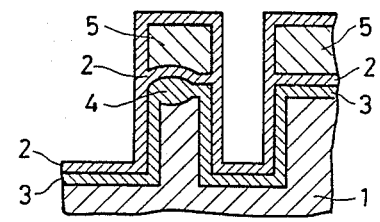
Figure 1E:
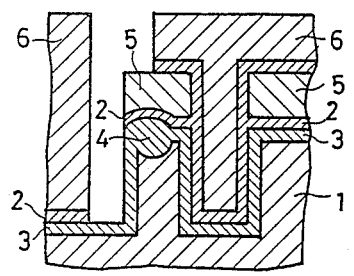
Figure 1F:
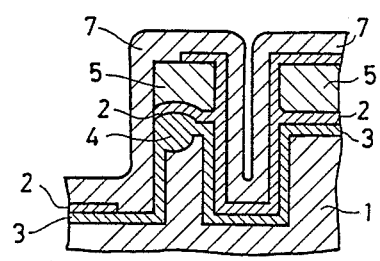
Figure 1G:
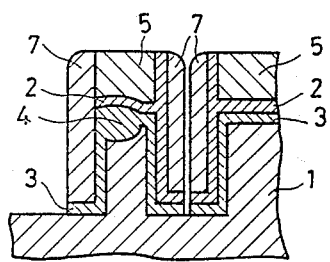
Figure 1H:
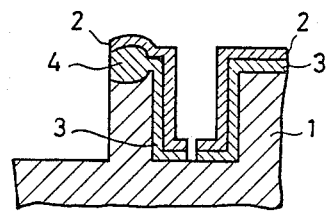
Figure 11:
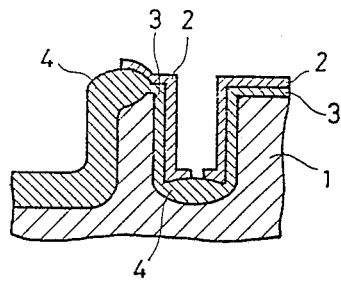
Figure 2A:
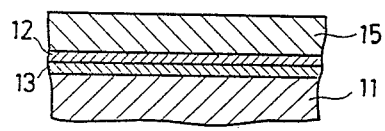
FIGS. 2A to 2G are schematic fragmentary sectional views, illustrating an embodiment according to the present invention.

Referring to FIG. 2A, an underlayer 13 of silicon oxide, an oxidation mask layer 12 of silicon nitride and a first etching mask layer 15 of silicon oxide are stacked in this order over an upper main surface of a silicon substrate 11.

Figure 2B:
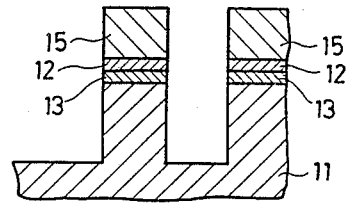

Referring to FIG. 2B, the first etching mask layer 15 is patterned by photolithography and then trenches are cut through the oxidation mask layer 12 and underlayer 13 into the substrate 11 by etching with the patterned first etching mask 15.

Figure 2C:
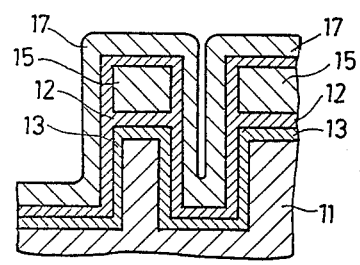

Referring to FIG. 2C, the exposed silicon surfaces in the trenches of the substrate 11 are thermally oxidized and then the entire free surface over the substrate is covered with a further formed oxidation mask layer 12 of silicon nitride. Thereafter, the entire free surface of the oxidation mask layer 12 is covered with a second etching mask layer 17 of silicon oxide.

Figure 2D:
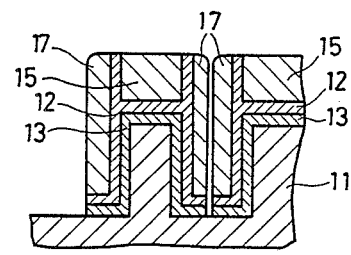

Referring to FIG. 2D, the second etching mask layer 17 is subjected to an anisotropic etching such as a reactive ion etching from above, thereby to remove the oxidation mask layer 12 and underlayer 13 in the bottom region of the trenches.

Figure 2E:
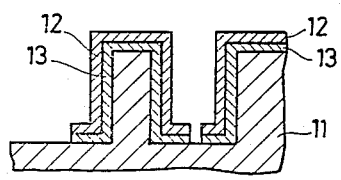

Referring to FIG. 2E, the first and second etching masks 15 and 17 are removed.

Figure 2F:
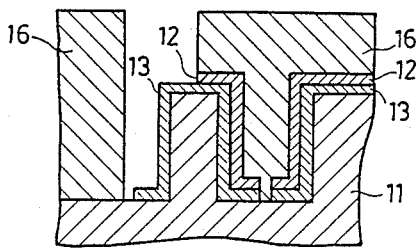

Referring to FIG. 2F, the oxidation mask layer 12 is further patterned in an island region and in a side wall region of a trench by etching with a third etching mask 16 of a multi-level resist which has been patterned by photolithography. In this figure, only the first-level resist 16 is shown as remained.

Figure 2G:
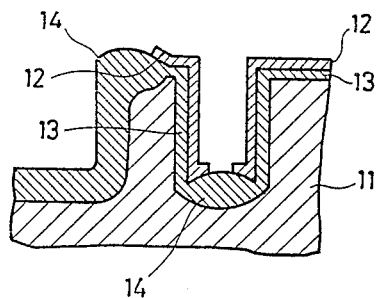

Finally referring to FIG. 2G, after removing the third etching mask 16, the silicon substrate 11 is thermally oxidized with the further patterned oxidation mask 12. As a result, isolation oxide films 14 are simultaneously formed not only in the island region but also in the side wall and bottom regions of the trenches.

FIGS. 3A to 3D illustrate another embodiment according to the present invention. At the earlier steps of this embodiment, a silicon substrate 11 is processed similarly as shown in FIGS. 2A to 2E. Namely, FIG. 3A corresponds to FIG. 2E.

Figure 3A:
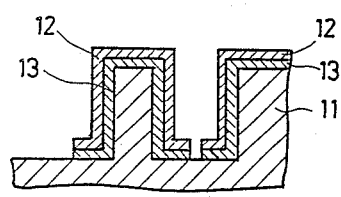
FIGS. 3A to 3D are schematic fragmentary sectional views, illustrating another embodiment according to the present invention.
Figure 3B:
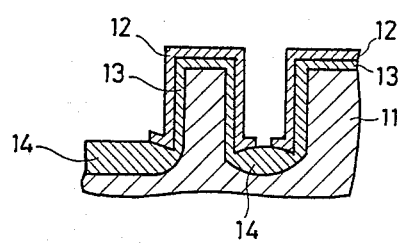

Referring to FIG. 3B, the silicon substrate 11 is thermally oxidized with the oxidation mask 12, thereby to form isolation oxide films 14 in the bottom regions of the trenches.

Figure 3C:
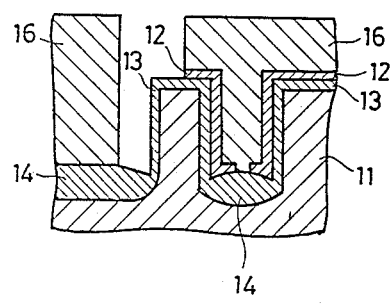

Referring to FIG. 3C, the oxidation mask 12 is further patterned in an island region and in a side wall region of a trench by etching with a third etching mask 16 of a multi-level resist which has been patterned by photolithography.

Figure 3D:
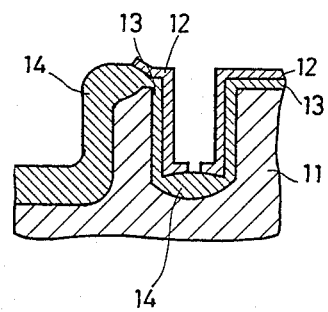

Finally referring to FIG. 3D, after removing the third etching mask 16, the silicon substrate 11 is again thermally oxidized with the further patterned oxidation mask 12, thereby to form further isolation oxide fins 14 Simultaneously in the island region and in the side wall region of the trench.

Although the present invention has been described and illustrate in detail, it is clearly understood that the same is by way of illustration and example only and is not to be taken by way of limitation, the spirit and scope of the present invention being limited only by the terms of the appended claims.

What is claimed is:

1. A method for fabricating a semiconductor device which includes one or more trenches each having side walls and a bottom face as well as one or more islands bounded by the trenches, comprising the steps of:
   preparing a silicon substrate (11) having an upper main surface;
   depositing an oxidation mask layer (12) over the main surface;
   etching the oxidation mask layer (12) and the substrate (11) with a first etching mask (15), thereby to form the trenches and islands;
   depositing an additional oxidation mask layer (12) to cover the entire free surface over the substrate;
   covering the entire free surface of the oxidation mask layer (12) with a second etching mask layer (17);
   patterning the oxidation mask layer (12) in the bottom regions of the trenches by anisotropically etching the second etching mask (17) from above;
   forming a third etching mask (16) after removing the first and second etching masks (15, 17);
   further patterning the oxidation mask layer (12) in the island regions and in the side wall regions of the trenches by etching with the third etching mask (16); and oxidizing the substrate (11) with the further patterned oxidation mask (12) after removing the third etching mask (16), thereby to form isolation oxide films not only in the island regions but also in the side wall and bottom regions of the trenches.

2. A method in accordance with claim 1, wherein the oxidation mask layer is of silicon nitride.

3. A method in accordance with claim 2, wherein the oxidation mask layer further includes an underlayer (13) of silicon oxide.

4. A method in accordance with claim 1, wherein the anisotropic etching is a reactive ion etching.

5. A method in accordance with claim 1, wherein the third etching mask is of a multi-level resist.

6. A method for fabricating a semiconductor device which includes one or more trenches each having side walls and a bottom face as well as one or more islands bounded by the trenches, comprising the steps of:
preparing a silicon substrate (11) having an upper main surface;
depositing an oxidation mask layer (12) over the main surface;
etching the oxidation mask layer (12) and the substrate (11) with a first etching mask (15), thereby to form the trenches and islands;
depositing an additional oxidation mask layer (12) to cover the entire free surface over the substrate;
covering the entire free surface of the oxidation mask layer (12) with a second etching mask layer (17);
patterning the oxidation mask layer (12) in the bottom regions of the trenches by anisotropically etching the second etching mask (17) from above;
oxidizing the substrate (11) with the patterned oxidation mask (12) after removing the first and second etching masks (15, 17), thereby to form isolation oxide films in the bottom regions of the trenches;
further patterning the oxidation mask layer (12) in the island regions and in the side wall regions of the trenches by etching with a third etching mask (16); and
oxidizing the substrate (11) with the further patterned oxidation mask (12) after removing the third etching mask (16), thereby to form isolation oxide layer in the island regions and in the side wall regions of the trenches.

7. A method in accordance with claim 6, wherein the oxidation mask layer is of silicon nitride.

8. A method in accordance with claim 7, wherein the oxidation mask layer further includes an underlayer (13) of silicon oxide.

9. A method in accordance with claim 6, wherein the anisotropic etching is a reactive ion etching.

10. A method in accordance with claim 6, wherein the third etching mask is of a multi-level resist.

* * * * *